United States Patent [19]

Katagiri et al.

[11] 4,021,800
[45] May 3, 1977

[54] NON-LINEAR CODER FOR PULSE CODE MODULATION OF TELEPHONE SIGNALS OR THE LIKE

[75] Inventors: Yoshio Katagiri; Ryuichi Suda, both of Tokyo, Japan

[73] Assignee: Nippon Electric Company, Ltd., Tokyo, Japan

[22] Filed: Apr. 16, 1975

[21] Appl. No.: 568,762

[30] Foreign Application Priority Data

Apr. 16, 1974 Japan .............................. 49-42945

[52] U.S. Cl. ................... 340/347 AD; 179/15 AV; 340/347 M
[51] Int. Cl.² ...................................... H03K 13/01
[58] Field of Search ............ 340/347; 179/15.55 T, 179/15 AV, 15 AC

[56] References Cited

UNITED STATES PATENTS

| | | | |
|---|---|---|---|
| 3,016,528 | 1/1962 | Villars ....................... | 340/347 DA |
| 3,017,626 | 1/1962 | Muller ......................... | 340/347 |
| 3,500,247 | 3/1970 | Sekimoto et al. ........... | 340/347 AD |
| 3,573,795 | 4/1971 | Bowers et al. .............. | 340/347 DA |
| 3,676,600 | 7/1972 | Kaneko et al. .............. | 179/15.55 T |
| 3,678,413 | 7/1972 | Wakeling ..................... | 325/38 R X |
| 3,678,505 | 7/1972 | Mostyn ....................... | 340/347 AD |
| 3,688,221 | 8/1972 | Fruhalf ....................... | 340/347 UX |
| 3,745,555 | 7/1973 | Carbrey ....................... | 340/347 AD |
| 3,760,407 | 9/1973 | Terry .......................... | 340/347 NT |
| 3,766,542 | 10/1973 | Tomozawa ................... | 340/347 DD |
| 3,872,466 | 3/1975 | Wold .......................... | 340/347 AD |
| 3,905,028 | 9/1975 | Wintz et al. ................. | 340/347 AD |
| 3,906,489 | 9/1975 | Schlichte .................... | 340/347 DA |
| 3,911,427 | 10/1975 | Schlichte .................... | 340/347 DA |

OTHER PUBLICATIONS

CCITT Recommendation G.711 (White Book, Mar del Plata, 1968).

Primary Examiner—Thomas J. Sloyan
Attorney, Agent, or Firm—Sughrue, Rothwell, Mion, Zinn & Macpeak

[57] ABSTRACT

A non-linear coder for use in a time-division multiplex pulse code modulation telephone transmission system is disclosed. Non-linear coding is accomplished by the selection of each segment that is necessary for coding by control pulses in accordance with the magnitude of an analog input signal. This is implemented in the feedback loop of the non-linear coder logic which selects among switching circuits in a local decoder a desired group of switching circuits in response to the input analog level.

1 Claim, 6 Drawing Figures

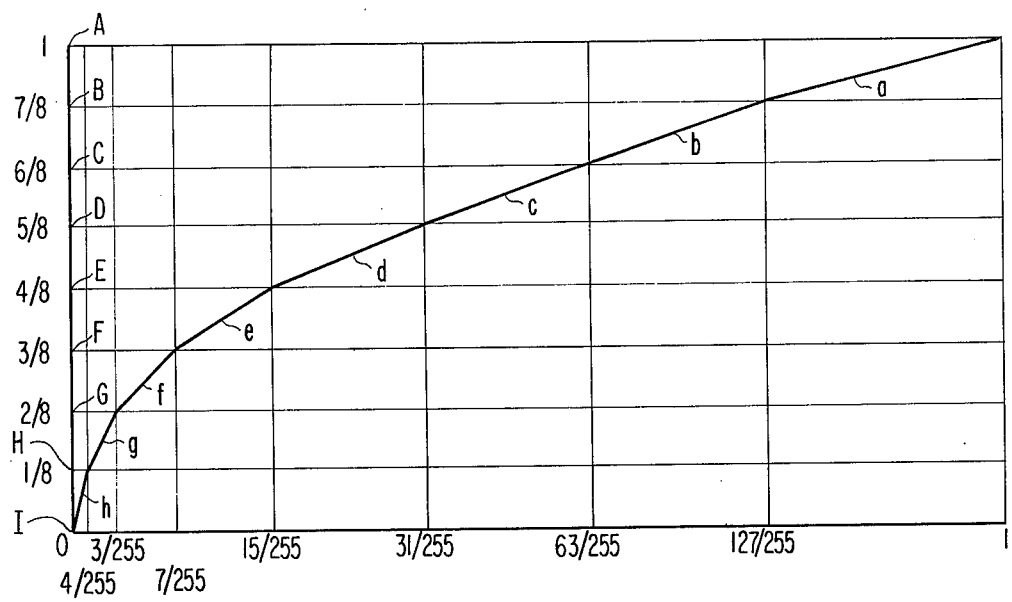
FIG.1 PRIOR ART
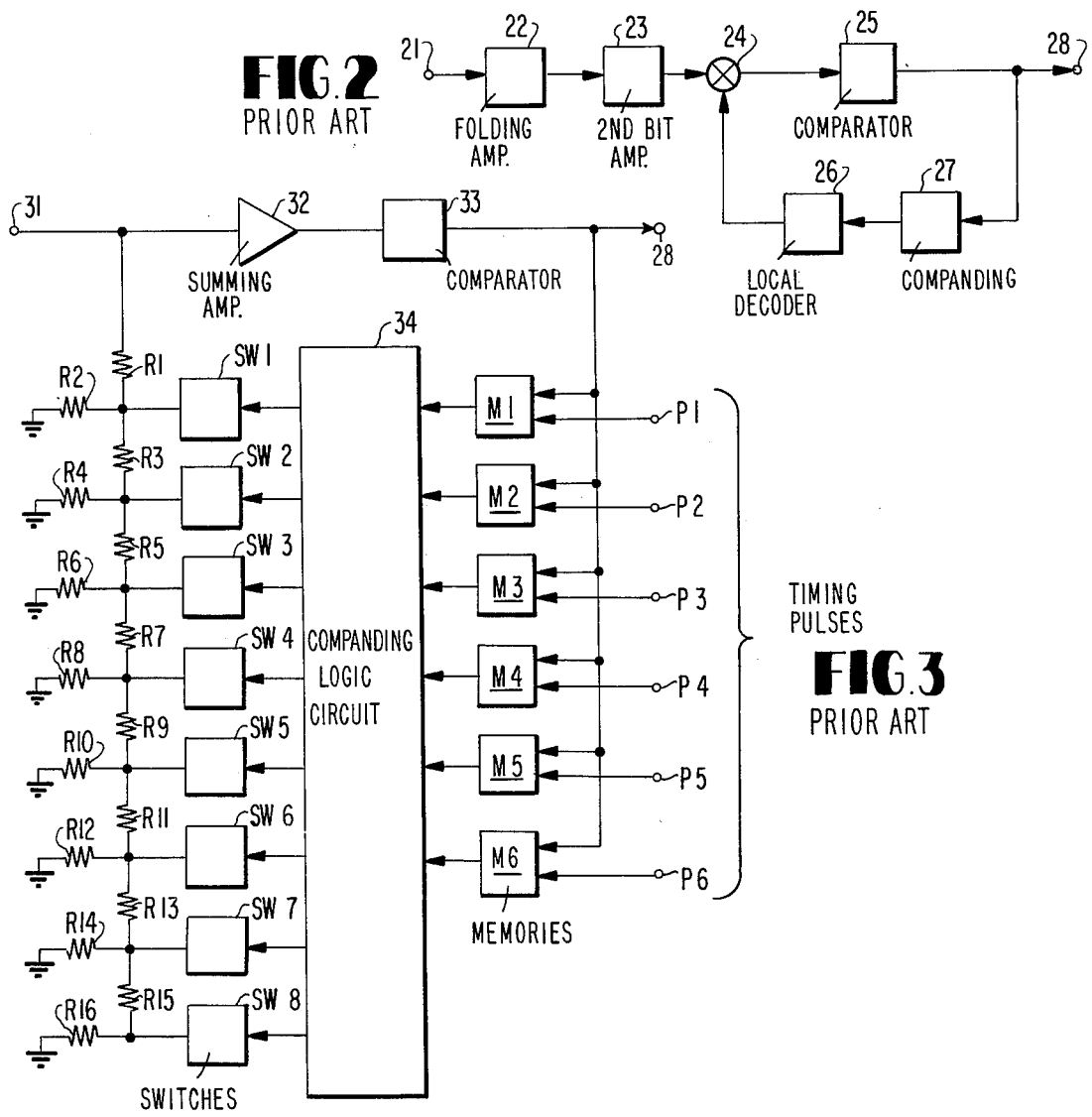
FIG.2 PRIOR ART
FIG.3 PRIOR ART

NON-LINEAR CODER FOR PULSE CODE MODULATION OF TELEPHONE SIGNALS OR THE LIKE

BACKGROUND OF THE INVENTION

1. Field of the Invention

This invention relates to a non-linear coder for use in a time-division multiplex pulse code modulation telephone transmission system and the like.

2. Description of the Prior Art

Conventional non-linear coding systems for use in telephone transmission are generally based on digital companding. Those are exemplified by the so-called "A-law" or "$\mu$-law", each having a companding matrix in the feedback loop thereof. An example of such non-linear coding systems is shown in U.S. Pat. No. 3,676,600 to Kaneko et al. Although feedback type coders are widely used because of their simplicity in construction, they have an inherent problem of loop delay time which is the composite delay time inherent to the circuit forming the feedback loop of the feedback type coder. This affects the coding period, that is, the time period form coding of a certain particular bit to coding of the subsequent bit. A high speed coder must have a short coding period, so that high speed operations are required for the respective circuits forming the feedback loop. The coding speed is limited mainly by the companding matrix used in the feedback loop.

SUMMARY OF THE INVENTION

An object of the present invention is to provide a non-linear coder in which the logic operation inserted into a feedback loop is extremely simplified by employing a construction such that among switching circuits in a local decoder a desired group of switching circuits are selectively used in response to the input analog level, and in which memory circuits can be directly driven by feedback pulses.

BRIEF DESCRIPTION OF THE DRAWINGS

Now the invention will be described more in detail referring to the accompanying drawings, in which FIG. 1 is a characteristic diagram of a $\mu$-law 15-segment coder;

FIG. 2 is a block diagram of a non-linear coder in the prior art;

FIG. 3 is a circuit diagram of a feedback type coder shown in FIG. 2;

DESCRIPTION OF THE PREFERRED EMBODIMENT

Figure 4:
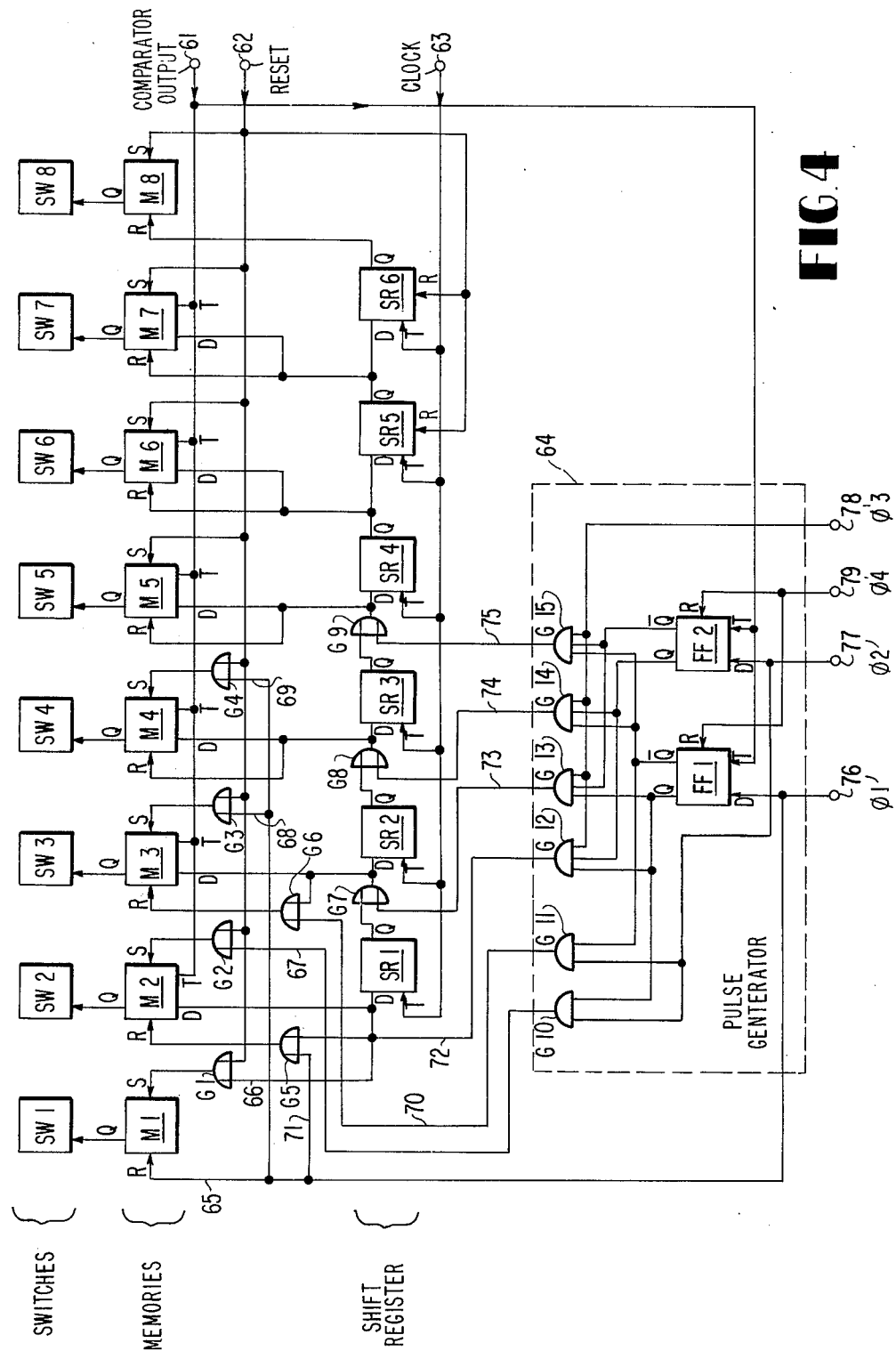
FIG. 4 is a circuit diagram of one preferred embodiment of the present invention.

FIG. 1 shows an example of the $\mu$-law 15-segment characteristics. The abscissa represents an analog signal, while the ordinate represents a digital signal. Reference letters $a \sim h$ represent respective segments, and letters $A \sim I$ represent boundary points between the respective segments. Within one segment, linear coding is carried out. The quantizing step to be used for the linear coding within each segment has a weight twice as large as that within the adjacent segment having a lower signal level. The analog signal represented by the abscissa corresponds to the local decoder output, while the digital signal represented by the ordinate corresponds to the output digital code. Though the abscissa and ordinate, respectively, represent the input analog signal and output digital signal with respect to their one polarity only, the opposite polarity of signals can be represented in a similar manner. Also the scales along the abscissa and ordinate respectively are indicated as normalized.

Now considering a $\mu$-law eight-bit feedback type coder by way of example, it is required in the coding with such many bits to reduce the necessary numbers of high precision resistors to be used in the feedback loop and thus substantially mitigate the sensitivity and precision required for a comparator used for the determination of the output codes. For such reasons, the construction is often employed in which the first and second bits are determined by the folding type coding stages and the third to eighth bits are coded in the feedback type coding stage.

The segments $a \sim d$ are used for determining the third to eighth bits under the condition that the second bit is "1", while the segments $e \sim h$ are used for determining the third to eighth bits under the condition that the second bit is "0". Each of the segments is used for determining the fifth to eighth bits. Therefore, the number of quantizing steps produced by all of the third to eighth bits has the following extension:

$$2^4 \cdot (1 + 2 + 4 + 8) = 2^8 - 2^4 = 2^8$$

A necessary number of digits $X$ for representing a given number N is determined with respect to a base $a$ of the logarithm of N by the following formula:

$$X \geq \log_a N \ (x \text{ being an integer})$$

When handling binary numbers, the base $a$ of the logarithm is 2, and $N = 2^8$ is assumed.

Accordingly, we obtain $$X = \log_2 2^8 = 8.$$

Since the number of digits is equal to the necessary number of the switches to be connected to the weighting circuit, the number of switches is eight. Therefore, the level range represented by the third to eighth bits of the non-linear codes corresponds to that represented by eight-bit linear code.

According to the present invention, selection of each segment that is necessary for coding is controlled by control pulses in accordance with a magnitude of an input analog signal.

The weighting circuit consisting of $m$ bits, can deliver $2^m$ kinds of signal level states, i.e., analog values. If the extension of the entire signal levels represented by $m$ bits is normalized, a magnitude of one step is then equal to $178^m$. If only the upper $n$ bits ($n < m$) among the $m$ bits of the weighting circuit are used with the lower ($m-n$) bits fixed, then coarse quantization results. A magnitude of one step at that time is equal to $\frac{1}{2}^n$. On the other hand, if only the lower $n$ bits ($n = m$) are used with the remaining upper ($m-n$) bits fixed, then fine quantization results. A magnitude of one step at that time is equal to $\frac{1}{2}^m$. In addition, if only the intermediate $n$ bits are used with the remaining upper and lower bits fixed, then a magnitude of a quantization step can be arbitrarily varied depending upon where the $n$ bits in this case are disposed.

As described above, it is one feature of the present invention to accomplish non-linear coding by controlling the position, that is, the segment of the $n$-bit quantization with control pulses. As a result of the above-described feature, it is possible to overcome the shortcoming in the prior art that a delay time is increased owing to a companding circuit for converting from a non-linear code to a linear code, and thus to realize a high speed non-linear coder.

In FIG. 2, a sequential feedback type digital companding coder of such type that the first and second bits are determined by folding type coders, is illustrated.

An input analog signal applied to an input terminal 21 is rectified by means of a folding amplifier 22. Its output is applied to a second bit amplifier 23, in which high gain amplification is achieved for an input having a level lower than a second bit decision level, while low gain amplification is achieved for an input having a level higher than the second bit decision level, and at the same time a second bit decision is made. The amplified output of the second bit amplifier is added with an output of a local decoder 26 by an adder 24 and the sum if fed to a comparator 25. In this comparator 25 is determined the polarity of the added signal, and a coded output is obtained at an output terminal 28. If the polarity of the added signal is positive, the comparator output becomes 1, while if it is negative, the output becomes 0. This output signal is fed back to a companding logic circuit 27, whose output drives a weighting circuit in the local decoder 26. In this way the output of the local decoder is successively changed and the code decision is sequentially made starting from the bit having the largest weight. Thus coding on an analog signal can be accomplished.

Further, a more detailed description of the local decoder will be made with reference to FIG. 3. To an input terminal 31 is applied the output of the second bit amplifier 23. Resistors R1~R16 constitute a weighting circuit. A current obtained by this weighting circuit and the analog signal applied to the terminal 31 are added by an adder 32 and fed to a comparator 33. In this comparator 33 is made the decision of the polarity of the added output signal. M1~M6 represent memory circuits which store the output of the comparator 33 upon receiving every one of timing clock pulses P1~P6. SWA~SW8 represent switching circuits for driving the weighting circuit composed of R1~R16. In order to convert the non-linear code signal obtained at the outputs of the memory circuits M1~M6 into a linear code signal, a companding logic circuit 34 is used. The obtained linear code signal is applied to the switching circuit SW1~SW8. The switching circuits SW1~SW8 drive the weighting circuit. More particularly, the output of the comparator 33 is stored in the memory circuits M1~M6 bit by bit from B3 to B8 by the respective timing pulses P1~P6 each time the respective bits are coded. Each time one bit has been coded, the information stored in the memory circuits M1~M6 is fed to the switching circuits SW1 ~]SW8 for driving the weighting circuit via the companding logic circuit 34 to feed an appropriate current to the analog signal applied to the terminal 31. Since the output of the memory circuits must pass through the companding logic circuit to the switching circuits, the delay time is inherently large.

Figure 5:
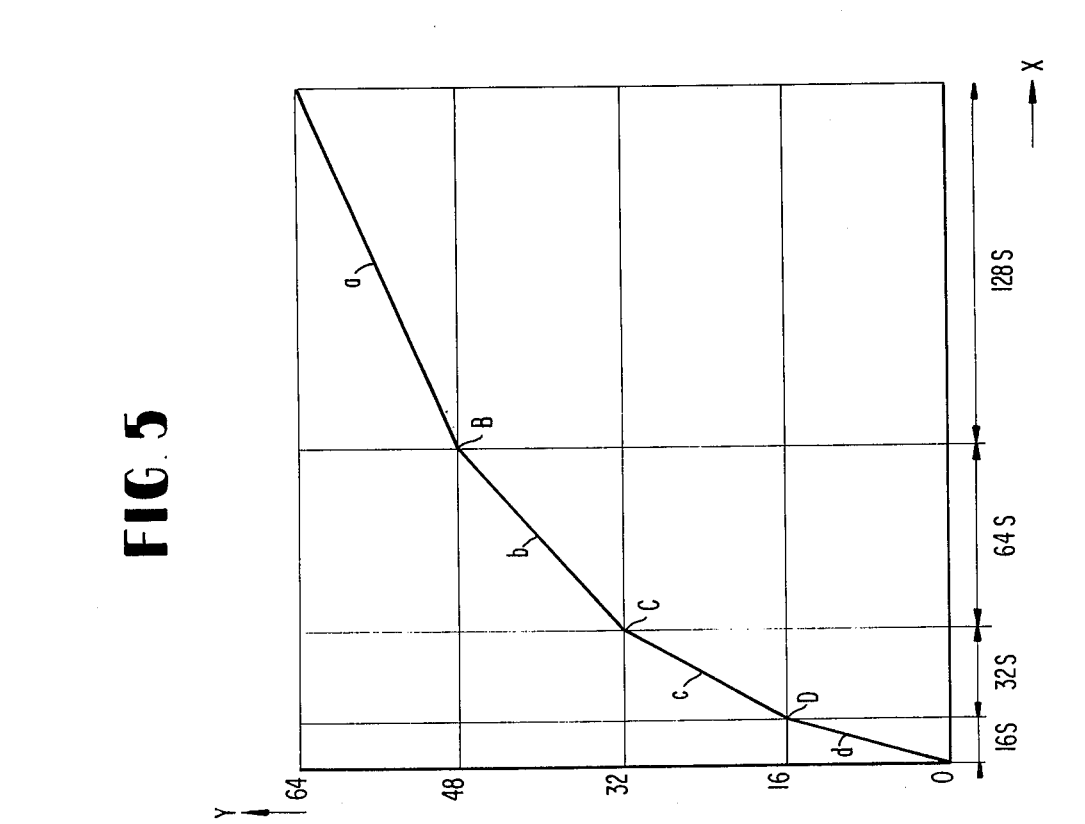
FIG. 5 is a diagram showing input-output characteristics of a local decoder for explaining an operation principle of the embodiment in FIG. 4.

In FIG. 4, SW1~SW8 represent switching circuits, M1~M8 represent memory circuits, and flip-flops SR1~SR6 constitute a shift register. The inputs R, D, T, and S of the memory devices M1~M8 are data input terminal, clock input terminal, set terminal and reset terminal, respectively. The memory devices may be, for example, SN7474's described in Texas Instruments' *TTL Data Book*. To an input terminal 61 is applied the output of the comparator. To an input terminal 62 is applied a final reset pulse. To an input terminal 63 are applied clock pulses for driving the shift register. From the comparator output applied to terminal 61, a pulse generator 64 delivers control pulses through wires 65, 66 . . ., 75 for controlling the memory circuits and the shift register. Gates G1 ~ G9 are OR gates for passing the pulses for controlling the memory circuits. In order to make the operation of this circuit more comprehensible, the relation between an input digital signal Y and an output analog signal X is shown in FIG. 5. The circuit shown in FIG. 4 includes memory circuits and switching circuits in the local decoder to be used for coding the third to eighth bits after the first and second bits have been determined, and accordingly, it is only necessary to consider the relation between the input digital signal and the output analog signal with respect to either one set of the segments $a \sim d$ or another set of the segments $e \sim h$ among the group of segments in FIG. 1. In other words, in the coding operation after the first and second bits have been determined, there remains the coding responsive to the four segments. As input digital signals in FIG. 5, there exist codes of six bits corresponding to the third to eighth bits, that is, $2^6 = 64$ kinds of codes. Therefore, for convenience, a region of 0~64 is indicated along the Y-axis in FIG. 5. The number of values which can be taken as the output analog signal is 64 because 16 values can be taken on each one of the four segments $a$, $b$, $c$ and $d$. Assuming that the minimum step is represented by $s$, the values are given by $s$, $2s$, $3s$, . . . . $15s$, $16s$, $18s$, $20s$, . . . , $46s$, $48s$, $52s$, $56s$, . . . , $108s$, $112s$, $120s$, $128s$, . . . , $232s$, $240s$. The currents applied to the output of the weighting circuit by the respective eight switches SW1~SW8 are the currents having weights of $128s$, $64s$, $32s$, $16s$, $8s$, $4s$, $2s$ and $s$. When the weighting circuit as shown in FIG. 3 is used, the state where all the switches are OFF corresponds to the point ($Y = 64$, $X = 240s$) in FIG. 5, and the state where all the switches are ON corresponds to the point ($Y = 1$, $X = s$). Accordingly, with regard to the respective junction points between the four segments in FIG. 5, a junction point B can be realized by setting only the switch SW1 ON and all the remainder OFF, a junction point C can be realized by setting only the swtiches SW1 and SW2 ON and all the remainder OFF, and a junction point D can be realized by setting only the switches SW1, SW2 and SW3 ON and all the remainder OFF.

In order to designate a particular segment where coding is accomplished, a start pulse is applied to a selected input of the shift register.

Figure 6:
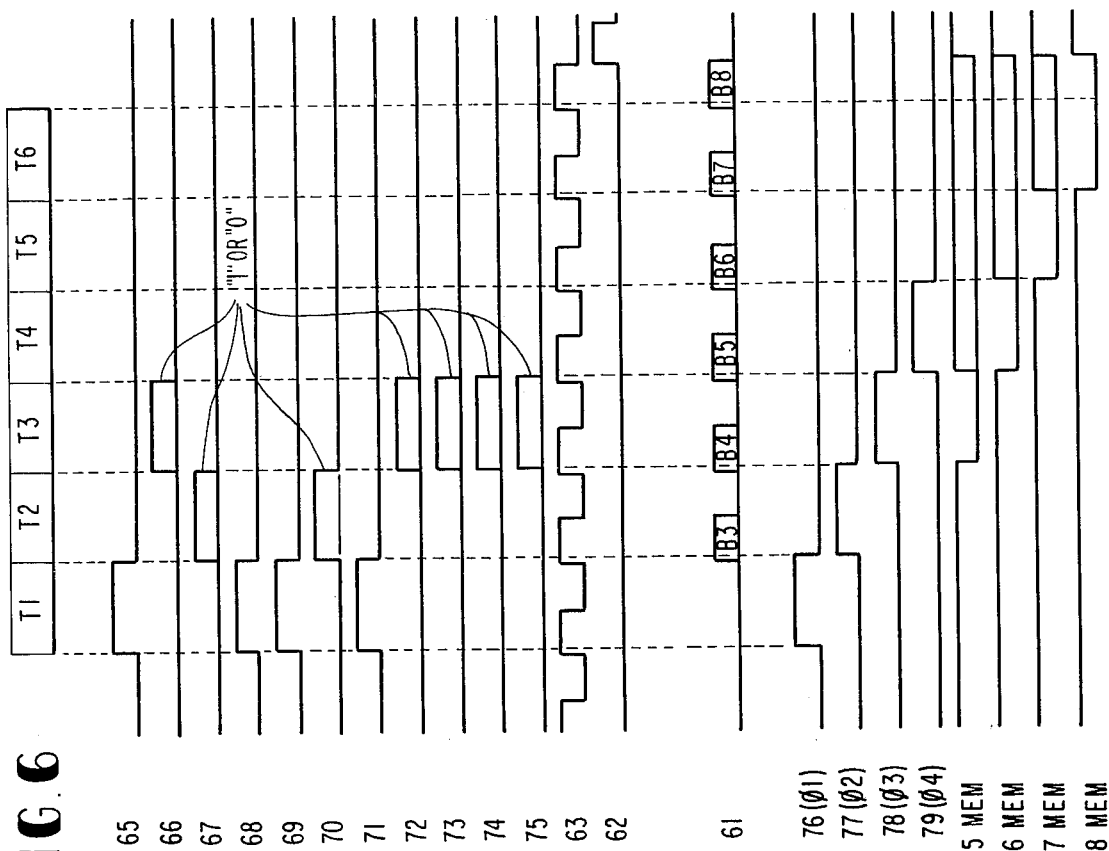
FIG. 6 is a time chart for assisting explanation of the embodiment in FIG. 4.

A time chart useful for explaining the operation of the embodiment in FIG. 4 is shown in FIG. 6.

At first the memory circuits M1~M8 are controlled by the final reset pulse fed through the terminal 62 so that their outputs may be turned 1 prior to the beginning of the coding. For the purpose of determining the third bit in the first time slot T1, the states of the control pulses of the control circuit 64 are established so that a current at the level of point C in FIG. 5 may be obtained. More particularly, in the time slot T1, pulses are fed through the wires 65 and 71 so that the outputs of the memory circuits M1 and M2 may become 0, and pulses are also fed through the wires 68 and 69 so that the outputs of the memory circuits M3 and M4 may become 1. Since the outputs of the memory circuits M3~M8 are set to 1 by the final reset pulse, the pulses are not always fed through the wires 68 and 69. Under the aforementioned state, the third bit is determined during the first time slot T1. According to the result of determination, it is determined whether the analog signal delivered from the second bit amplifier exists in the region $a, b$ in FIG. 5 or in the region $c, d$. The region $a, b$ corresponds to the case where the third bit is 1, while the region $c, d$ corresponds to the case where the third bit is 0. Subsequently, in the second time slot T2 in the coding process, in accordance with the result of determination of third bit, determination of the fourth bit is accomplished by producing a current at the point B in FIG. 5 if B3 = 1, while by generating a current at the point D if the third bit is 0. In the process of generating an analog output signal corresponding to the point B, it is only necessary to turn only the switch SW1 ON and the remaining switches OFF, so that it is only required to make the output of the memory circuit M1 0 and the outputs of the other memory circuits M2–M8 1. That is, in the case where the third bit is 1, it is only necessary to feed in the time slot T2 a pulse through the wire 67 so that the output of the memory unit M2 may be turned to 1. Also, for generating the current at the point D, it is only necessary to turn only the switches SW1, SW2 and SW3 ON and all the other switches OFF, so that in case the third bit is 0, it is only required to feed in the time slot T2 a pulse through the wire 70 so as to turn the output of the memory circuit M3 0.

Here, by making reference to the result of the determination of the third and fourth bits which was made in the first and second time slots T1 and T2 in the coding process, it becomes clear on which one of the segments $a, b, c$ and $d$ in FIG. 5 the analog signal exists. Then the coding of the fifth to eighth bits is accomplished during the third to sixth time slots (T3–T6) according to the conventional feedback type coding process. If the analog signal exists within the segment $a$, then the switch SW1 is turned OFF in the beginning of the time slot T3 by feeding a control pulse through the wire 66 to turn the output of the memory circuit M1, 1, and then the coding is accomplished by making use of the switches SW1~SW5. Assuming that the code existing within the segment $a$ corresponds to the bit condition that the thrid and fourth bits are 1, then by making reference to the results of that determination, the switch SW2 is turned ON in the beginning of the time slot T3 by feeding a control pulse through the wire 72 to turn the output of the memory unit M2 to 0. The same control pulse is also applied to the data input of the first stage flip-flop SR1 as a start pulse for the shift register, so that in the subsequent time slots T4, T5 and T6, shift pulses can be obtained at the outputs of the subsequent stages of the shift register or the flip-flops SR2, SR3 and SR4, respectively. In other words, in response to these shift pulses, the switches SW2–SW5 are used for coding the third to eighth bits during the time slots T3~T6. In FIG. 6 is shown by B5 MEM~B8 MEM time charts for the memory circuits among those M1~M8, which are used for the fifth to eighth bits. It is to be noted that after completion of coding, all of the outputs of the stages of the shift register or flip-flops SR1~SR6 are reset to 0 by the final reset pulse so as to be ready to start control of the next coding operation.

If the result of determination of the third and fourth bits shows that the analog signal exists within the segment $b$, that is, if the third and fourth bits are 1 and 0, respectively, then by making reference to these results, a start pulse for the shift register is applied through the wire 73 in the beginning of the third time slot T3, and thereby coding of the fifth to eighth bits can be accomplished in a similar manner to the aforementioned case of the segment $a$. In this case, in the beginning of the time slot T3, the switch SW1 is turned ON and the switch SW2 is turned OFF, and thus the coding can be accomplished by making use of the switches SW3~SW6. On the other hand, if the third and fourth bits are 0 and 1, respectively, that is, the analog signal exists within the segment $c$, then the switches SW1 and SW2 are turned ON and the switch SW3 is turned OFF, and further a start pulse is fed through the wire 74 so that the coding for the fifth to eighth bits may be accomplished in the time slots T3~T6, respectively, by making use of the switches SW4~SW7. Similarly, if both the third and fourth bits are 0, that is, the analog signal exists within the segment $d$, then the switches SW1, SW2 and SW3 are turned ON and the switch SW4 is turned OFF, and further a start pulse is fed through the wire 75 so the coding for the fifth to eighth may be accomplished in the time slots T3~T6, respectively, by making use of the switches SW5~SW8. In these respective cases, the coding for the fifth to eighth can be carried out in a similar manner to the case where the analog signal exists within the segment $a$.

As described above, in response to the results of the determination of the third and fourth bits, the control circuit 64 generates the necessary control pulses for controlling the selection of the stages which function as the shift register, whereby the digital companding feedback type coding can be accomplished.

As will be obvious by reference to FIG. 4, the comparator output is directly fed to the timing terminals of the memory cells in the memory circuit and is used as driving pulses for the memory circuit. Accordingly, the same coding time as that of the conventional feedback type coder for linear coding can be maintained. This implies that the feedback loop is shortened in comparison to the conventional digital companding coder as explained with reference to FIG. 3, and that high-speed digital companding coding can be accomplished.

It is to be noted that the aforementioned principle of the present invention is similarly applicable to a digital companding coding system in which a first bit is determined by a folding type coder, and a second and subsequent bits are determined in a feedback type coder.

What is claimed is:

1. A segment-type non-linear coder for converting an input analog signal to an M-bit (M is an integer greater than two) binary code through pulse code modulation, comprising a first coder for determining the most siginificant bit and $n$ subsequent bits ($n$ is an integer including zof the feedback type for determining the $(n+2)$th and the subsequent bits of said binary code, having in its feedback loop switching circuits, a weighting circuit having a plurality of inputs and an output, the outputs of said switching circuits being connected to corresponding inputs of said weighting circuit, said weighting circuit for generating a decoded analog signal at its output in response to the states of said switching circuits, an adder for adding the output analog signal of said first coder to said decoded analog signal from said weighting circuit, a comparator for delivering a binary output code in response to the polarity of the output of said adder, and a logic circuit for converting said binary output code to control pulses for controlling said switching circuits, characterized in that said logic circuit comprises:

memory circuits commonly coupled to the output of said comparator and respectively coupled to said switching circuits;

a shift register whose shifted pulse is in turn coupled to the data inputs of said memory circuits; and a control pulse generator coupled to the output of said comparator for controlling said memory circuits and said shift register, said control pulse generator selecting a group of said switching circuits and a starting stage of said shift register by the $(n+2)$th through $(n+k)$th bits ($k$ is an integer greater than 2, $n+k < M$) of said binary output code, the selected group of switching circuits operating, under control of a group of adjacent stages of said shift register starting from the selected stage thereof, as a group of switching circuits for a linear coder within a segment of the analog input versus digital output characteristics of said non-linear coder.

* * * * *

UNITED STATES PATENT AND TRADEMARK OFFICE
CERTIFICATE OF CORRECTION

PATENT NO. : 4,021,800
DATED : May 3, 1977
INVENTOR(S) : Yoshio Katagiri et al

It is certified that error appears in the above-identified patent and that said Letters Patent are hereby corrected as shown below:

IN THE SPECIFICATION:

Col. 2, line 10, after "ordinate" insert a comma; same line, after "respectively" insert a comma
　　　　line 14, delete "with such" insert --of--
　　　　line 33, delete "$2^4$." insert --$2^4$.--
　　　　line 33, delete " = $2^8$" insert -- $\doteq 2^8$ --
　　　　line 60, delete "$178^m$" insert --$1/2^m$--
　　　　line 64, delete "(n = m)" insert --(n < m)--

Col. 3, line 38, delete "on" insert --of--
　　　　line 51, delete "SWA" insert --SW1--
　　　　line 64, delete " ] "

Col. 5, line 51, delete "SW1" insert --SW2--

IN THE CLAIMS:

Col. 6, line 62, delete "zof" insert --zero--; same line, after "zero" insert --and smaller than M) of said binary code, a second coder--

Signed and Sealed this

Eighteenth Day of October 1977

[SEAL]

Attest:

RUTH C. MASON
Attesting Officer

LUTRELLE F. PARKER
Acting Commissioner of Patents and Trademarks